United States Patent
Yang et al.

(10) Patent No.: US 9,006,878 B2
(45) Date of Patent: Apr. 14, 2015

(54) METHOD AND DEVICE FOR WAFER SCALE PACKAGING OF OPTICAL DEVICES USING A SCRIBE AND BREAK PROCESS

(75) Inventors: Xiao "Charles" Yang, Cupertino, CA (US); Dongmin Chen, Saratoga, CA (US); Philip Chen, Beaverton, OR (US)

(73) Assignee: Miradia Inc., Santa Clara, CA (US)

( * ) Notice: Subject to any disclaimer, the term of this patent is extended or adjusted under 35 U.S.C. 154(b) by 1203 days.

(21) Appl. No.: 12/891,518

(22) Filed: Sep. 27, 2010

(65) Prior Publication Data

US 2011/0012166 A1 Jan. 20, 2011

Related U.S. Application Data (62) Division of application No. 12/029,899, filed on Feb. 12, 2008, now Pat. No. 7,825,519, which is a division of application No. 11/008,483, filed on Dec. 8, 2004, now Pat. No. 7,344,956.

(51) Int. Cl.
| | |
|---|---|
| *H01L 33/48* | (2010.01) |
| *B81C 1/00* | (2006.01) |
| *H01L 23/00* | (2006.01) |

(52) U.S. Cl.
CPC .......... *B81C 1/00873* (2013.01); *H01L 33/483* (2013.01); *B81B 2201/047* (2013.01); *H01L 2924/0002* (2013.01); *H01L 24/05* (2013.01); *H01L 2224/48463* (2013.01)

(58) Field of Classification Search
None
See application file for complete search history.

(56) References Cited

U.S. PATENT DOCUMENTS

| | | | |
|---|---|---|---|
| 3,997,964 A | 12/1976 | Holbrook et al. | |
| 4,094,058 A | 6/1978 | Yasutake et al. | |

(Continued)

FOREIGN PATENT DOCUMENTS

| | | |
|---|---|---|
| WO | WO 01/29890 A2 | 4/2001 |
| WO | WO 03/054927 A2 | 7/2003 |
| WO | WO 2004/099065 A1 | 11/2004 |

OTHER PUBLICATIONS

International Search Report and Written Opinion for PCT Application No. PCT/US2005/044249 mailed on Sep. 11, 2006, 9 pages.

(Continued)

*Primary Examiner* — Matthew W Such
*Assistant Examiner* — Abul Kalam
(74) *Attorney, Agent, or Firm* — Kilpatrick Townsend & Stockton LLP (57) ABSTRACT

A multilayered integrated optical and circuit device. The device has a first substrate comprising at least one integrated circuit chip thereon, which has a cell region and a peripheral region. Preferably, the peripheral region has a bonding pad region, which has one or more bonding pads and an antistiction region surrounding each of the one or more bonding pads. The device has a second substrate with at least one or more deflection devices thereon coupled to the first substrate. At least one or more bonding pads are exposed on the first substrate. The device has a transparent member overlying the second substrate while forming a cavity region to allow the one or more deflection devices to move within a portion of the cavity region to form a sandwich structure including at least a portion of the first substrate, a portion of the second substrate, and a portion of the transparent member. The one or more bonding pads and the antistiction region are exposed while the one or more deflection devices is maintained within the portion of the cavity region.

14 Claims, 13 Drawing Sheets

(56) References Cited

U.S. PATENT DOCUMENTS

| | | | |
|---|---|---|---|
| 5,457,022 | A | 10/1995 | Hioki et al. |
| 5,801,068 | A | 9/1998 | Sooriakumar et al. |
| 6,075,280 | A | 6/2000 | Yung et al. |
| 6,093,623 | A | 7/2000 | Forbes |
| 6,294,439 | B1 | 9/2001 | Sasaki et al. |
| 6,344,369 | B1 | 2/2002 | Huang et al. |
| 6,396,711 | B1 | 5/2002 | Degani et al. |
| 6,417,075 | B1 | 7/2002 | Haberger et al. |
| 6,500,760 | B1 * | 12/2002 | Peterson et al. ............. 438/684 |
| 6,514,789 | B2 | 2/2003 | Denton et al. |
| 6,562,658 | B2 | 5/2003 | Ohuchi et al. |
| 6,566,745 | B1 | 5/2003 | Byenne |
| 6,653,210 | B2 | 11/2003 | Choo et al. |
| 6,664,503 | B1 | 12/2003 | Hsieh et al. |
| 6,822,326 | B2 | 11/2004 | Enquist et al. |
| 6,891,592 | B2 | 5/2005 | Magana et al. |
| 6,939,473 | B2 | 9/2005 | Nasiri et al. |
| 7,005,732 | B2 | 2/2006 | Horning et al. |
| 7,022,245 | B2 | 4/2006 | Pan et al. |
| 7,344,956 | B2 | 3/2008 | Yang et al. |
| 7,825,519 | B2 | 11/2010 | Yang et al. |
| 2001/0022382 | A1 | 9/2001 | Shook |
| 2002/0163069 | A1 | 11/2002 | Lu et al. |
| 2002/0181838 | A1 | 12/2002 | Cunningham et al. |
| 2003/0025984 | A1 | 2/2003 | Gudeman et al. |
| 2004/0017537 | A1 * | 1/2004 | Magana et al. ............... 349/187 |
| 2004/0087053 | A1 | 5/2004 | Lytle et al. |
| 2004/0219764 | A1 | 11/2004 | Syllaios et al. |
| 2005/0233546 | A1 | 10/2005 | Oohata et al. |
| 2006/0046436 | A1 | 3/2006 | Ohuchi et al. |
| 2006/0138673 | A1 | 6/2006 | Kim |
| 2006/0160273 | A1 | 7/2006 | Chen |

OTHER PUBLICATIONS

Notice of Allowance of Jul. 2, 2010 for U.S. Appl. No. 12/029,899, 7 pages.
Office Action of Mar. 10, 2010 for U.S. Appl. No. 12/029,899, 7 pages.
Office Action of Nov. 2, 2009 for U.S. Appl. No. 12/029,899, 5 pages.
Notice of Allowance of Oct. 18, 2007 for U.S. Appl. No. 11/008,483, 7 pages.
Office Action of Jul. 5, 2007 for U.S. Appl. No. 11/008,483, 9 pages.
Office Action of Nov. 28, 2006 for U.S. Appl. No. 11/008,483, 15 pages.

* cited by examiner

FIG. 13 tion includes a method and structure for packaging optical devices for bonded substrates. Merely by way of example, the invention has been applied to integrating a mechanical based structure with an integrated circuit chip. But it would be recognized that the invention has a much broader range of applicability.

METHOD AND DEVICE FOR WAFER SCALE PACKAGING OF OPTICAL DEVICES USING A SCRIBE AND BREAK PROCESS

CROSS-REFERENCES TO RELATED APPLICATIONS

This application is a division of U.S. patent application Ser. No. 12/029,899, filed on Feb. 12, 2008, which is a division of U.S. patent application Ser. No. 11/008,483, filed on Dec. 8, 2004, the disclosures of which are hereby incorporated by reference in their entirety for all purposes.

BACKGROUND OF THE INVENTION

The present invention relates generally to packaging techniques. More particularly, the invention includes a method and structure for packaging optical devices for bonded substrates. Merely by way of example, the invention has been applied to integrating a mechanical based structure with an integrated circuit chip. But it would be recognized that the invention has a much broader range of applicability.

Visual display technologies have rapidly developed over the years. Most particularly, electronic displays for outputting television shows, streaming video, and the like. From the early days, cathode ray tube technology, commonly called CRTs, outputted selected pixel elements onto a glass screen in conventional television sets. These television sets originally output black and white moving pictures. Color television sets soon replaced most if not all black and white television units. Although very successful, CRTs were often bulky, difficult to make larger, and had other limitations.

CRTs were soon replaced, at least in part, with liquid crystal panel displays. These liquid crystal panel displays commonly called LCDs used an array of transistor elements coupled to a liquid crystal material and color filter to output moving pictures in color. Many computer terminals and smaller display devices often relied upon LCDs to output video, text, and other visual features. Unfortunately, liquid crystal panels often had low yields and were difficult to scale up to larger sizes. These LCDs were often unsuitable for larger displays often required for television sets and the like.

Accordingly, projection display units have been developed. These projection display units include, among others, a counterpart liquid crystal display, which outputs light from selected pixel elements through a lens to a larger display to create moving pictures, text, and other visual images. Another technology is called "Digital Light Processing" (DLP), which is a commercial name from Texas Instruments Incorporated (TI) of Texas, USA. DLP is often referred to as the use of "micro-mirrors." DLP relies upon a few hundred thousand tiny mirrors, which line up in 800 rows of 600 mirrors each. Each of the mirrors is hinged. An actuator is attached to each of the hinges. The actuator is often electrostatic energy that can tilt each of the mirrors at high frequency. The moving mirrors can modulate light, which can be transmitted through a lens and then displayed on a screen. Although DLP has been successful, it is often difficult to manufacture and subject to low yields, etc. DLP is also manufactured using MEMS based processing techniques. Such MEMS based processing technique is often costly and difficult to scale up for efficient processing. More specifically, packaging techniques used for MEMS are also difficult and costly to scale up.

From the above, it is seen that an improved technique for packaging devices is desired.

SUMMARY OF THE INVENTION

According to the present invention, techniques for packaging optical devices are provided. More particularly, the invention includes a method and structure for packaging optical devices for bonded substrates. Merely by way of example, the invention has been applied to integrating a mechanical based structure with an integrated circuit chip. But it would be recognized that the invention has a much broader range of applicability.

In a specific embodiment, the present invention provides a method for separating one or more chips from bonded wafer scale substrate structures. The method includes providing a first substrate comprising at least one integrated circuit chip thereon, which has a cell region and a peripheral region. Preferably, the peripheral region comprises a bonding pad region, which has one or more bonding pads and an antistiction region surrounding each of the one or more bonding pads. The method includes coupling a second substrate comprising at least one or more deflection devices thereon to the first substrate and exposing at least one or more bonding pads on the first substrate. The method also includes coupling a transparent member overlying the second substrate while forming a cavity region to allow the one or more deflection devices to move within a portion of the cavity region to form a sandwich structure including at least a portion of the first substrate, a portion of the second substrate, and a portion of the transparent member. The method forms a first scribe line on a first portion of the transparent member while maintaining a vicinity of the first scribe line associated with a first portion of the first substrate free from the first scribe line and forms a second scribe line on a second portion of the transparent member and a second portion of the first substrate. Preferably, the first portion of the first substrate and the second portion of the first substrate have the antistiction region formed between the first portion and the second portion. The method includes causing a portion of the transparent member to be removed via the first scribe line and the second scribe line and exposing the antistiction region and the one or more bonding pads on the first substrate.

In an alternative specific embodiment, the invention provides a multilayered integrated optical and circuit device. The device has a first substrate comprising at least one integrated circuit chip thereon, which has a cell region and a peripheral region. Preferably, the peripheral region has a bonding pad region, which has one or more bonding pads and an antistiction region surrounding each of the one or more bonding pads. The device has a second substrate with at least one or more deflection devices thereon coupled to the first substrate. At least one or more bonding pads are exposed on the first substrate. The device has a transparent member overlying the second substrate while forming a cavity region to allow the one or more deflection devices to move within a portion of the cavity region to form a sandwich structure including at least a portion of the first substrate, a portion of the second substrate, and a portion of the transparent member. The one or more bonding pads and the antistiction region are exposed while the one or more deflection devices is maintained within the portion of the cavity region.

In yet an alternative specific embodiment, the present invention provides a method for separating one or more chips from multilayered substrate structures. The method includes providing a first substrate, which has one or more bonding pads and a peripheral region. The method includes bonding a second substrate to the first substrate while maintaining a gap between a portion of the first substrate and a portion of the second substrate in the peripheral region. Preferably, the gap prevents attachment of the portion of the first substrate to the portion of the second substrate. The gap acts as an antistiction mechanism between portions of the substrates. The method includes removing a portion of the second substrate to expose the one or more bonding pads and the peripheral region on the first substrate, while a portion of the second substrate remains intact with the first substrate.

Still further, the invention provides a method for separating one or more chips from multilayered substrate structures. The method includes providing a first substrate, which has one or more bonding pads and a peripheral region, which has an antistiction region. The method includes bonding a second substrate to the first substrate while preventing attachment of a portion of the first substrate to a portion of the second substrate using the antistiction region. The method removes a portion of the second substrate to expose the one or more bonding pads and the peripheral region of the first substrate, while maintaining a portion of the second substrate intact with the first substrate.

Many benefits are achieved by way of the present invention over conventional techniques. For example, the present technique provides an easy to use process that relies upon conventional technology. In some embodiments, the method provides higher device yields for the bonded substrates. Additionally, the method provides a process that is compatible with conventional process technology without substantial modifications to conventional equipment and processes. Preferably, the invention provides for an improved integrated structure including integrated circuits and mirror structures for display applications. Preferably, the invention provides a wafer level process to separate complex bonded substrate structures. The wafer level process is more efficient and easier to use. Depending upon the embodiment, one or more of these benefits may be achieved. These and other benefits will be described throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for packaging optical devices are provided. More particularly, the invention includes a method and structure for packaging optical devices for bonded substrates. Merely by way of example, the invention has been applied to integrating a mechanical based structure with an integrated circuit chip. But it would be recognized that the invention has a much broader range of applicability.

Figure 1:
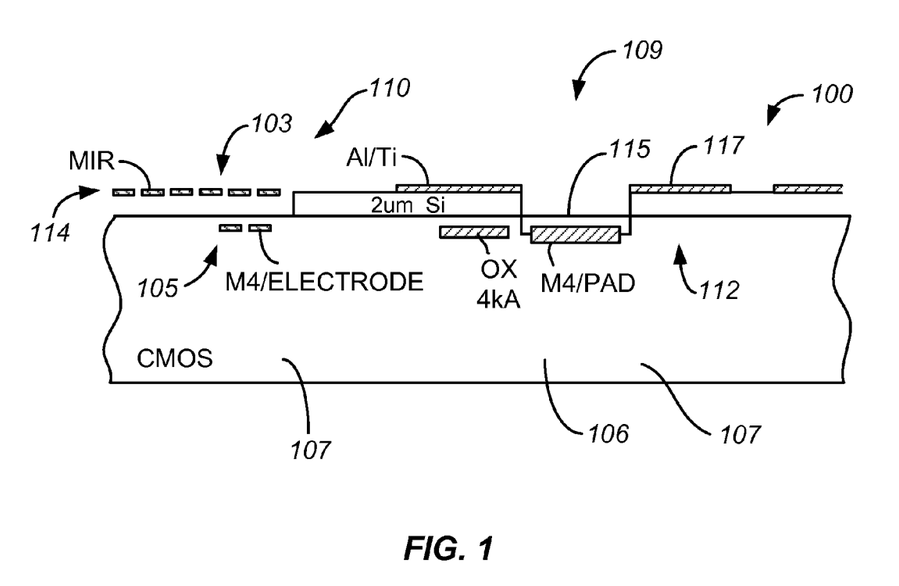
FIG. 1 is a simplified cross-sectional view diagram of integrated chip and mirror device including bond pad region according to an embodiment of the present invention.

FIG. 1 is a simplified cross-sectional view diagram of integrated chip and mirror device 100 including bond pad region according to an embodiment of the present invention. This diagram is merely an example, which should not unduly limit the scope of the claims herein. One of ordinary skill in the art would recognize many variations, modifications, and alternatives. As shown, the diagram illustrates a multilayered integrated optical and circuit device 100. The device has a first substrate 101 comprising at least one integrated circuit chip thereon, which has a cell region 107 and a peripheral region 106. The integrated circuit chip can be a CMOS integrated circuit chip that is foundary compatible, although other chips can be used. In a specific embodiment, the chip includes drivers, cell regions, and other integrated circuit devices. Preferably, the peripheral region has a bonding pad region 109, which has one or more bonding pads and an anti-stiction region 112 surrounding each of the one or more bonding pads. Preferably, the peripheral region has an anti-stiction characteristic throughout such region. The device has a second substrate 114 with at least one or more deflection devices 103 thereon formed in an array configuration 110 and the second substrate is coupled to the first substrate. The deflection devices can be mirror structures, which are each coupled to electrode structures 105. Each of the electrode structures is coupled to a drive circuit and other control circuitry (not shown) to provide a voltage to cause an electrostatic force between the deflection device and the electrode. The deflection device, which is pivotable, moves in a first direction when subjected to the electrostatic force and moves in a second direction when the force has been removed according to a specific embodiment. Further details of the integrated chip and mirror device can be found at U.S. patent application Ser. No. 10/756,936, filed Jan. 13, 2004; now U.S. Pat. No. 7,118,234, which is commonly assigned and hereby incorporated by reference for all purposes.

As also shown, the device also has at least one or more bonding pads 115 exposed on the first substrate. An opening in the second substrate is provided to expose the one or more bonding pads. The device also has anti-stiction region 117, which is provided on a peripheral portion of the first substrate, which is also a peripheral region of the second substrate. The anti-stiction region can be provided by any suitable material such as combinations of aluminum, titanium, titanium nitride, gold, silver, copper, or any combination of these, including alloys or any other element on the Periodic Table that may be suitable. An upper surface of the anti-stiction region is designed to prevent sticking to a silicon bearing material, such as silicon dioxide, silicon, nitride, bare silicon, and like materials, according to a specific embodiment.

Figure 2:
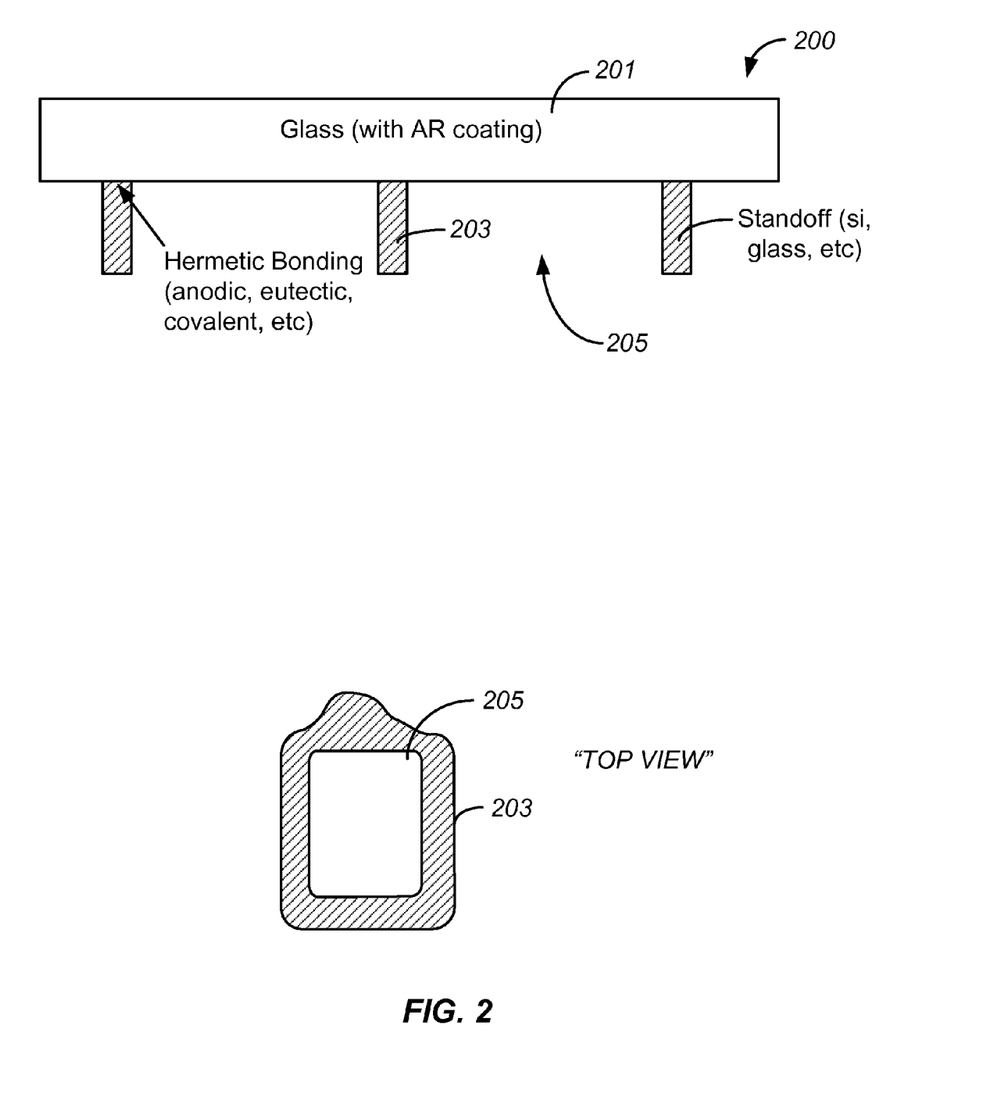
FIG. 2 is a simplified cross-sectional view diagram of a package assembly including a glass plate and stand-off regions according to an embodiment of the present invention.

FIG. 2 is a simplified cross-sectional view diagram of a package assembly 200 including a glass plate and stand-off regions according to an embodiment of the present invention. This diagram is merely an example, which should not unduly limit the scope of the claims herein. One of ordinary skill in the art would recognize many variations, modifications, and alternatives. As shown, the assembly 200 includes a plate 201, which is preferably optically transparent. The plate can be any suitable glass layer, or the like. The plate is attached to a standoff structure 203, which includes a plurality of standoff regions. The stand off regions form open region 205. A top-view diagram also illustrates open region 205 and standoff regions 203. As also shown, the substrate is a wafer scale type substrate, which will enclose a plurality of integrated circuit devices and mirror devices in chip form. Each of the chips will be provided within the standoff regions and be bounded by a portion of the plate. Further details on an integrated chip, mirror, and packaged assembly are provided throughout the present specification and more particularly below.

Figure 3:
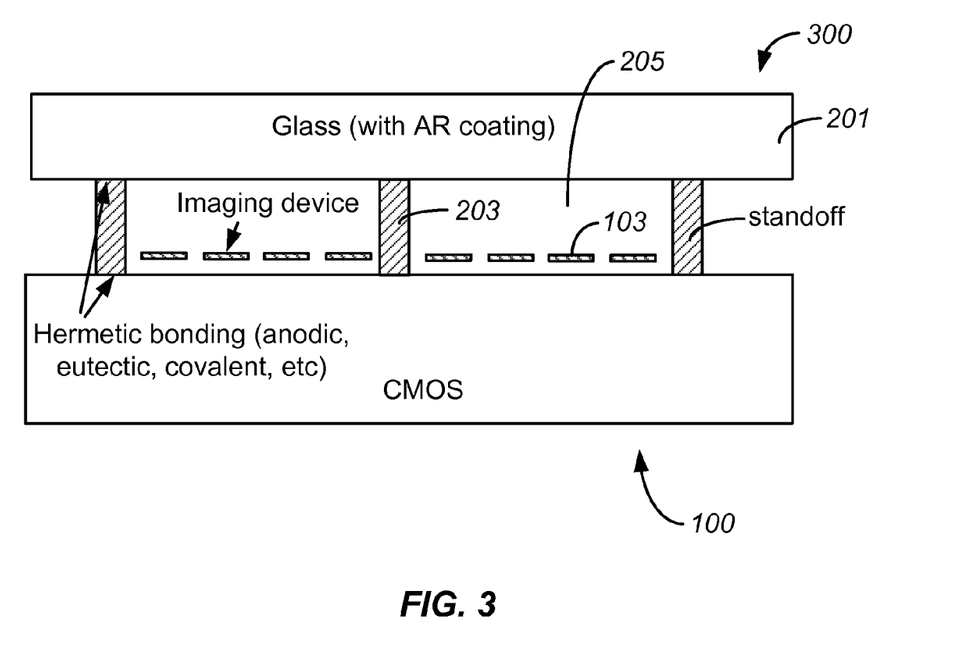
FIG. 3 is a simplified cross-sectional view diagram of a bonded chip and mirror device to package assembly according to an embodiment of the present invention.
Figure 4:
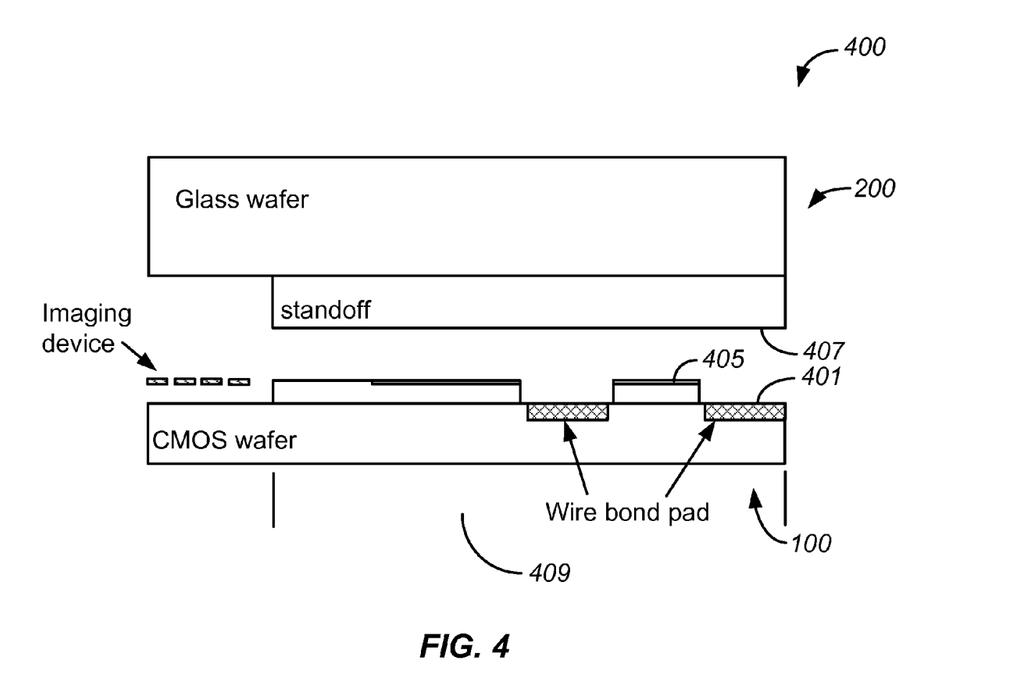
FIGS. 4 through 11 illustrate methods for bonding and separating the chip and mirror device to package assembly according to an embodiment of the present invention.

FIG. 3 is a simplified cross-sectional view diagram of a bonded chip and mirror device to package assembly according to an embodiment of the present invention. This diagram is merely an example, which should not unduly limit the scope of the claims herein. One of ordinary skill in the art would recognize many variations, modifications, and alternatives. As shown, the integrated chip, mirror, and packaged assembly 300 is provided. As shown, the assembly includes transparent plate 201, which includes standoff regions 203. Opening 205 is provided between the standoff regions. The assembly also has integrated circuit chip and mirror device 100, which has been bonded to the standoff regions. As shown, the opening forms a cavity region to allow the one or more mirror (e.g., deflection) devices 103 to move within a portion of the cavity region to form a sandwich structure including at least a portion of the first substrate, a portion of the second substrate, and a portion of the transparent member. Specific details of the present bonded structure can be found in U.S. patent application Ser. No. 10/756,923, filed Jan. 13, 2004; now U.S. Pat. No. 7,022,245, commonly assigned, and hereby incorporated by reference for all purposes. The one or more bonding pads and the antistiction region are exposed while the one or more deflection devices is maintained within the portion of the cavity region. Such bonding pad regions are shown in more detail throughout the present specification and more particularly below.

In a specific embodiment, the present invention provides a method for separating one or more chips from multilayered substrate structures according to the steps provided below.

1. Provide a first substrate, which has one or more bonding pads and a peripheral region (which includes an antistiction region);
2. Bond a second substrate to the first substrate while preventing attachment of a portion of the first substrate to a portion of the second substrate using the antistiction region;
3. Bond a third substrate to the second substrate to form a sandwich structure including the first substrate, the second substrate, and the third substrate;
4. Remove a portion of the third substrate to expose the one or more bonding pads and the peripheral region; and
5. Perform other steps, as desired.

The above sequence of steps provides a method according to an embodiment of the present invention. As shown, the method uses a combination of steps including a way of forming a peripheral region having anti-stiction properties for the manufacture of integrated chip, mirror, and packaged devices. Other alternatives can also be provided where steps are added, one or more steps are removed, or one or more steps are provided in a different sequence without departing from the scope of the claims herein. Details of using the above method are provided below.

FIGS. 4 through 11 illustrate methods for bonding and separating the chip and mirror device to package assembly according to an embodiment of the present invention. This diagram is merely an example, which should not unduly limit the scope of the claims herein. One of ordinary skill in the art would recognize many variations, modifications, and alternatives. In yet an alternative specific embodiment, the present invention provides a method for separating one or more chips from multilayered substrate structures. As shown, the methods include providing a first substrate 100, which has one or more bonding pads 401 and a peripheral region 409. The method includes bonding a second substrate to the first substrate while preventing attachment of a portion of the first substrate to a portion of the second substrate using an antistiction region 405 in the peripheral region. Preferably, the antistiction region prevents attachment of the portion of the first substrate to the portion of the second substrate.

Figure 5:
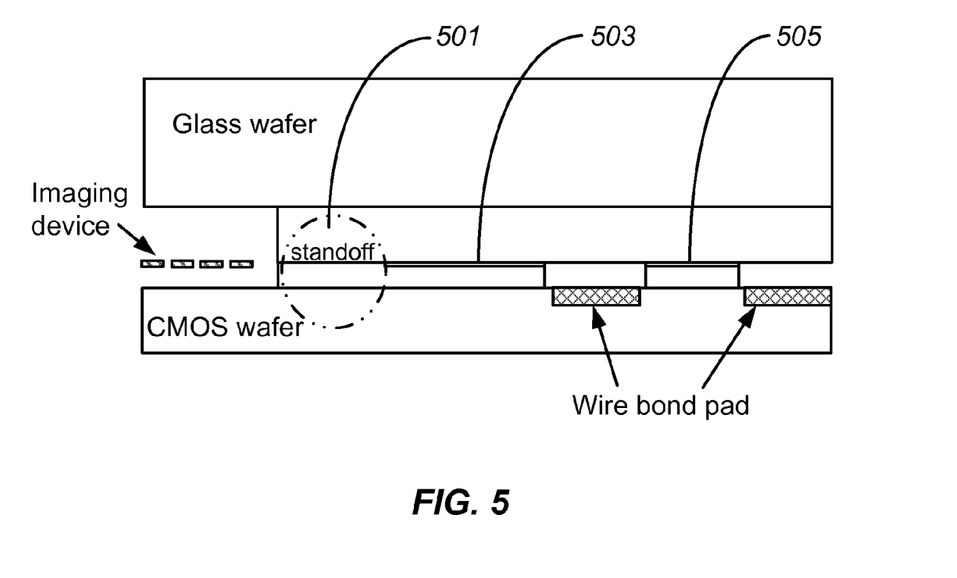

Referring to FIG. 5, the method includes bonding a third substrate 200 to the second substrate to form a sandwich structure including the first substrate, the second substrate, and the third substrate. The third substrate includes plate and standoff region. The stand off region includes surface region 407. The surface region bonds to a selected portion 501 of the peripheral region. The selected portion includes silicon surfaces that bond to each other using silicon on silicon or silicon on insulator bonding techniques. Alternatively, the bonding techniques include hermetic and/or non-hermetic seals. Other portions 503 and 505 include anti-stiction regions that do not attach the surfaces of the second substrate to the first substrate.

Figure 6:
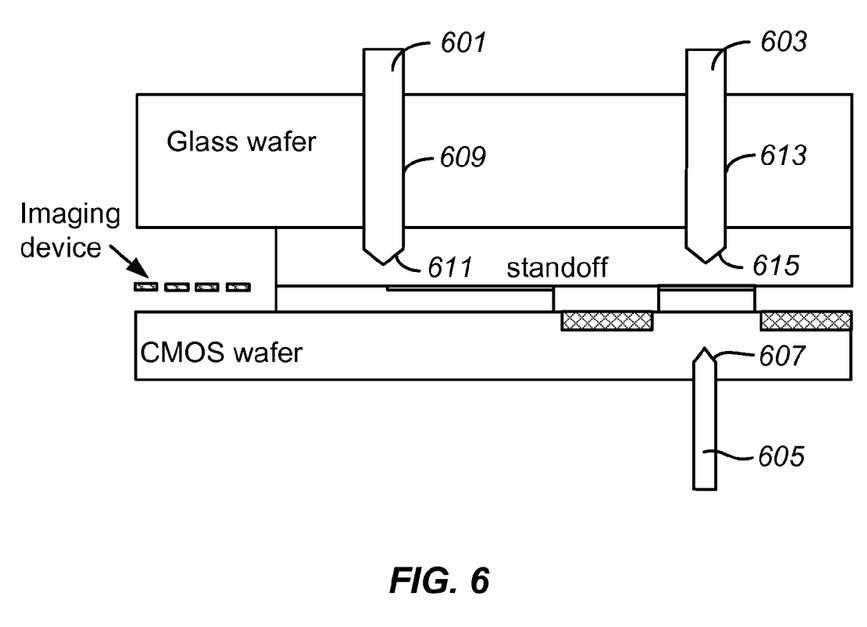

Referring now to FIG. 6, the method forms a plurality of scribe lines on selected portions of the bonded substrate structure. The method forms scribe line 607 via saw 605 through a portion of the first substrate. The scribe line is through a thickness of the first substrate but does not cut all the way through the first substrate. The scribe line 607 is provided on a scribe region of the chip, which is on a wafer, with a plurality of chips.

Figure 7:
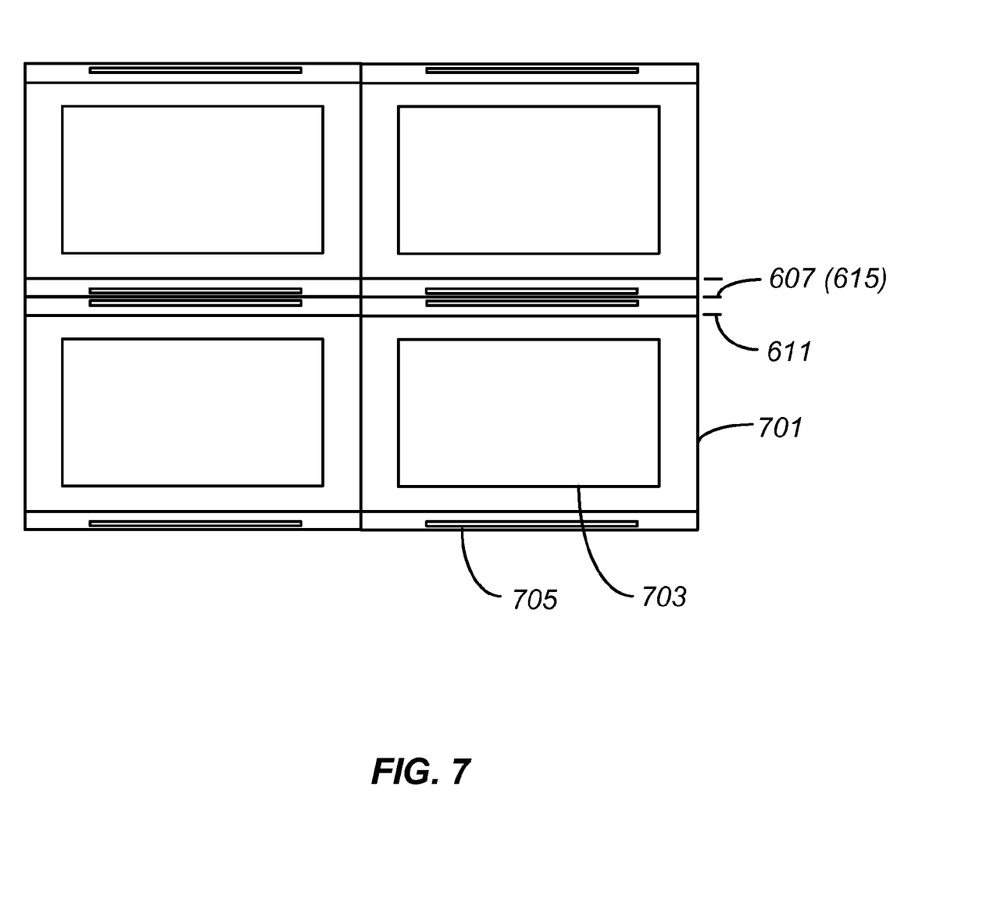
Figure 8:
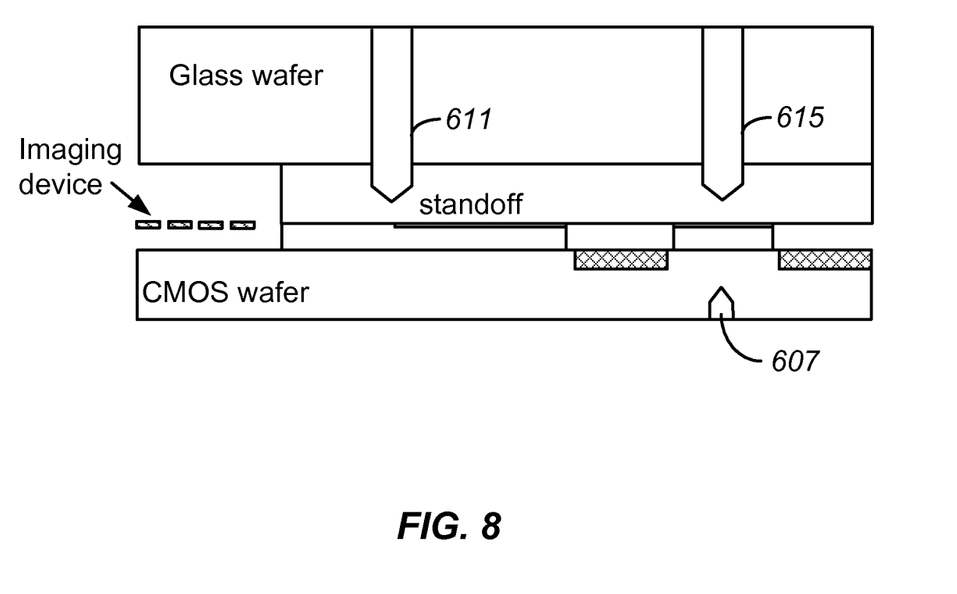

The method forms a pair of scribe lines 611 and 615 through an entirety of the plate and through a portion of the stand off region, as shown. Saw blade 601 cuts through plate 609 and through a portion of standoff 611. Saw blade 603 cuts through plate 613 and through a portion of standoff 615. Referring to FIG. 7, which illustrates a top-view diagram, the structure includes mirror array region 703 surrounded by standoff structure region 701. The standoff structure region forms a boundary between the array and peripheral region. The peripheral region includes scribe line 611 and 607 (615), which are like numbers as in the prior Figure. The structure also includes bonding pads 705, which are provided in the peripheral region. A final scribed structure is illustrated using FIG. 8. The final scribed structure includes scribe lines 611, 615, and 607. Scribe line 615 and 607 face each other with a thickness of material in-between. The thickness of material includes a portion of the standoff region, a portion of the second substrate, and first substrate. The second substrate includes anti-stiction region, which may be a material such as aluminum, or the like. Of course, one of ordinary skill in the art would recognize many variations, modifications, and alternatives.

Figure 9:
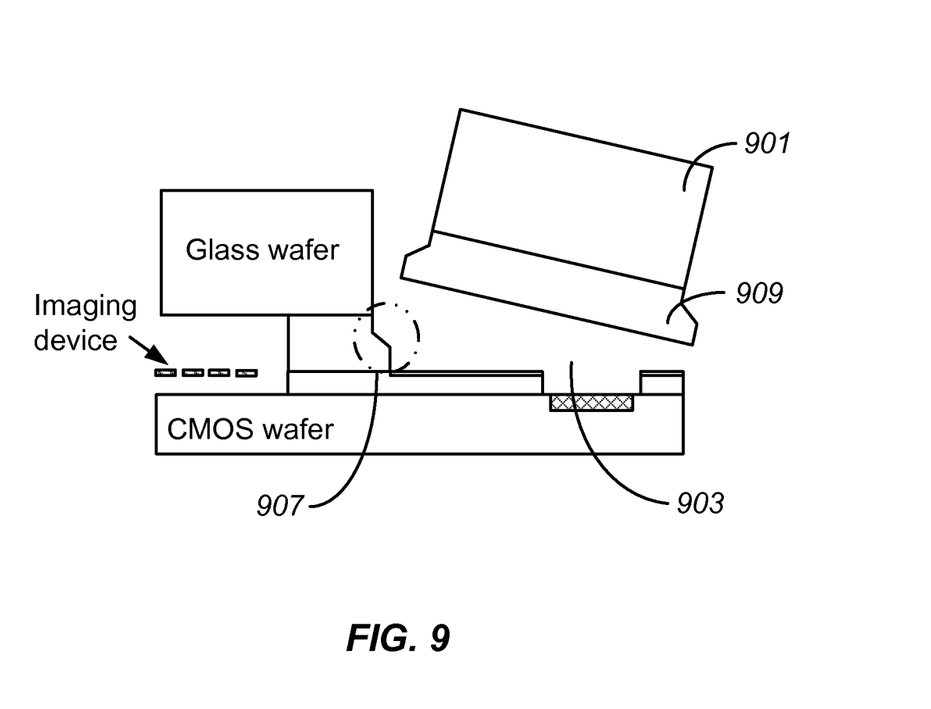
Figure 10:
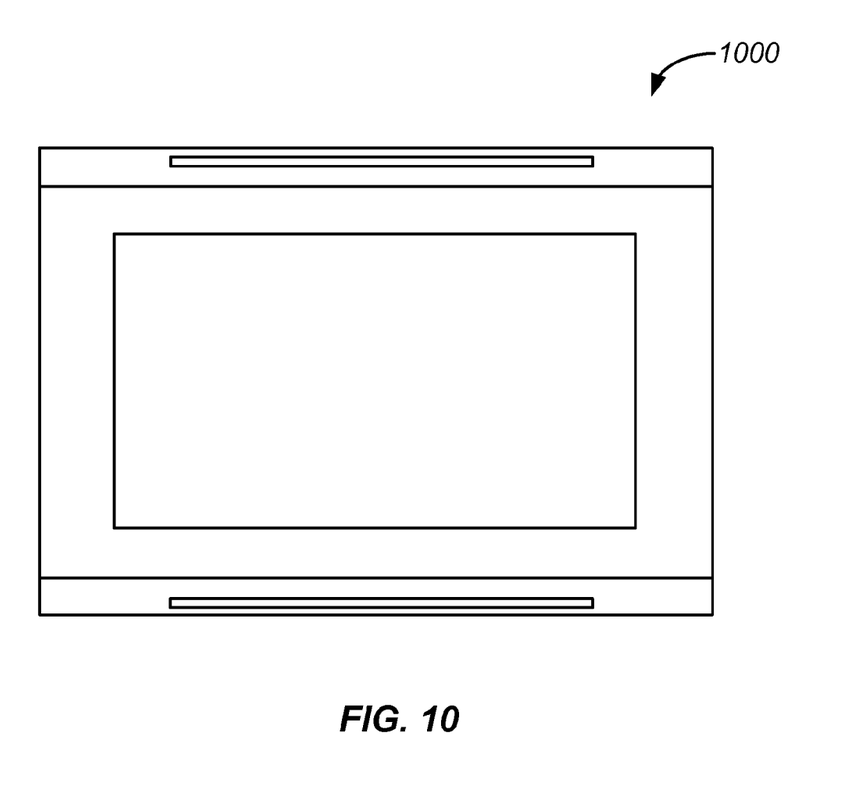

Referring to FIG. 9, the method includes removing a portion 901 of the third substrate to expose 903 the one or more bonding pads and the peripheral region. Preferably, removing occurs via breaking 907 a portion of the standoff region from the attached standoff region. Since other portions 903 of the standoff region are not attached to the second substrate, portion 901 is easily removed without damage to the bonding pads or other peripheral portions of the first and/or second substrate. As shown in FIG. 10, the multi-layered bonded substrate 1000 has been removed from the bonded wafer structure.

Figure 11:
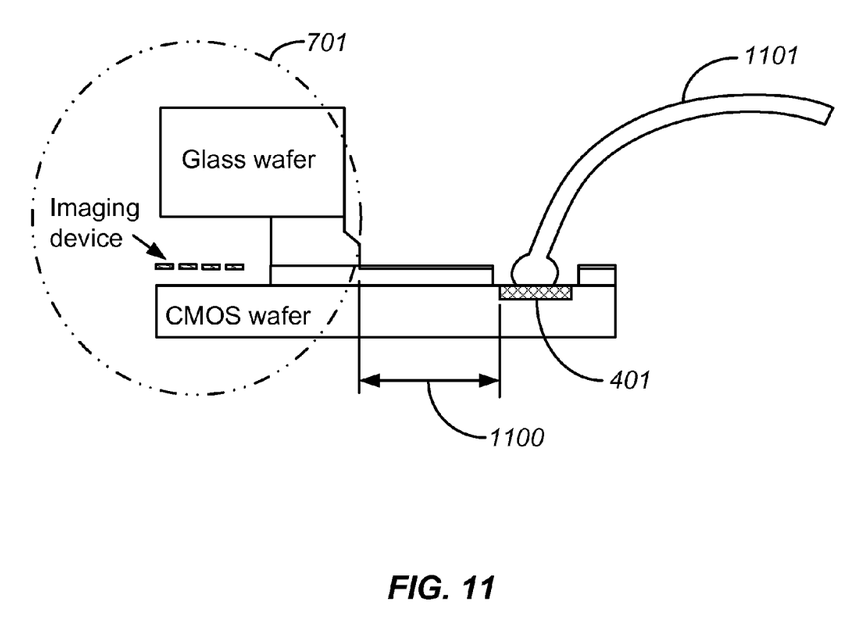

In a specific embodiment, the method forms a bonding process as illustrated by FIG. 11. The bonding process includes wire bonding wire 1101 to bonding pad 401, which is exposed on the peripheral region. The peripheral region also includes anti-stiction regions and break region. The bonded multilayered structure includes packaged region 701, which includes package assembly (e.g., plate and standoff)

bonded and sealed to integrated mirror and circuit structure 701, as shown. In a specific embodiment, the stand off region can have a thickness ranging from about 0.4 mm and greater depending upon the embodiment. The plate glass has a thickness of about ½ mm and other sizes, including thicker and thinner. As shown, the peripheral region 1100 between the bonding pad and standoff region should be enough to allow for bonding of the bonding wire. That is, the distance should accommodate a capillary of a bonding process. Preferably, the distance is at least 1 mm but can also be other dimensions depending upon the embodiment. The diagram also includes a region surrounding the bonding pad. In general, the region can be very small as long as the bonding pad is not damaged according to a specific embodiment. As also shown, the bonding pad is in a recessed region based upon a thickness of the second substrate, which is used to form the deflection and/or mirror devices according to a specific embodiment. Other embodiments of the present invention can be found throughout the present specification and more particularly below.

In yet an alternative specific embodiment, the present invention provides a method for separating one or more chips from multilayered substrate structures as described below.

1. Provide a first substrate, which has one or more bonding pads and a peripheral region;
2. Bond a second substrate to the first substrate while maintaining a gap between a portion of the first substrate and a portion of the second substrate in the peripheral region;
3. Prevent attachment of the portion of the first substrate to the portion of the second substrate using the gap;
4. Bond a third substrate to the second substrate to form a sandwich structure including the first substrate, the second substrate, and the third substrate;
5. Remove a portion of the third substrate to expose the one or more bonding pads and the peripheral region; and
6. Perform other steps, as desired.

The above sequence of steps provides a method according to an embodiment of the present invention. As shown, the method uses a combination of steps including a way of forming a peripheral region having anti-stiction properties via air gap for the manufacture of integrated chip, mirror, and packaged devices. Other alternatives can also be provided where steps are added, one or more steps are removed, or one or more steps are provided in a different sequence without departing from the scope of the claims herein. Details of using the above method are provided below.

Figure 12:
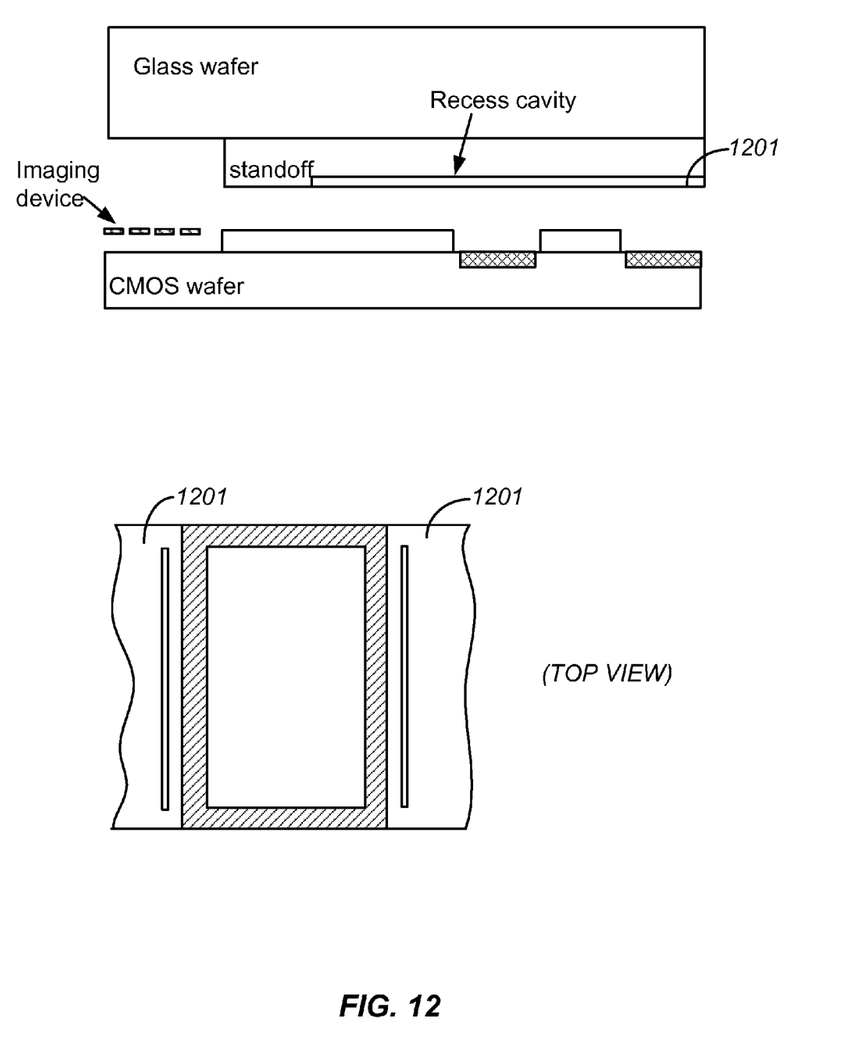
FIG. 12 is a simplified cross-sectional view diagram of a bonding pad peripheral structure according to an alternative embodiment of the present invention.

FIG. 12 is a simplified cross-sectional view diagram of a bonding pad peripheral structure according to an alternative embodiment of the present invention. These diagrams are merely examples, which should not unduly limit the scope of the claims herein. One of ordinary skill in the art would recognize many variations, modifications, and alternatives. Shown is a method for separating one or more chips from multilayered substrate structures. The method includes providing a first substrate, which has one or more bonding pads and a peripheral region. The method includes bonding a second substrate to the first substrate while maintaining a gap 1201 between a portion of the first substrate and a portion of the second substrate in the peripheral region. Preferably, the gap prevents attachment of the portion of the first substrate to the portion of the second substrate. The gap acts as an antistiction mechanism between portions of the substrates. Preferably, the method includes removing a portion of the second substrate to expose the one or more bonding pads and the peripheral region. Since the gap has been provided between certain portions of the first and second substrates, the portion of the second substrate is removed without attaching to the first substrate.

In a specific embodiment, the gap is designed to prevent attachment and/or adherence of the first and second substrates. The gap is often filled with air and/or other non-reactive gas according to a specific embodiment. The gap is often made using an etching process, which forms the recessed region in any one or both of the substrates. The recessed region is often about 1 micron or more depending upon the embodiment. As also shown in the top-view diagram, the gap surrounds a peripheral region of the standoff structure, which encloses the plate region to the chip structure. Of course, one of ordinary skill in the art would recognize many variations, alternatives, and modifications.

Figure 13:
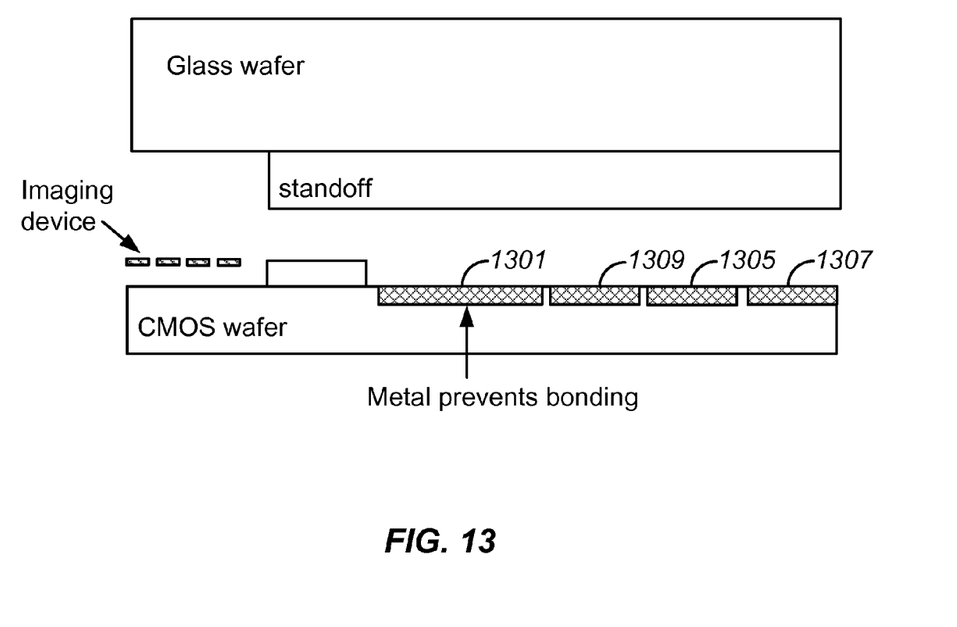
FIG. 13 is a simplified cross-sectional view diagram of a bonding pad peripheral structure according to yet an alternative embodiment of the present invention.

FIG. 13 is a simplified cross-sectional view diagram of a bonding pad peripheral structure according to yet an alternative embodiment of the present invention. This diagram is merely an example, which should not unduly limit the scope of the claims herein. One of ordinary skill in the art would recognize many variations, modifications, and alternatives. As shown in an alternative specific embodiment, the peripheral portion includes a plurality of dummy metal layers 1301, 1309, and 1307. Bonding pad 1305 is also shown. The plurality of dummy metal layers forms antistiction regions, which are used to prevent attachment of the first substrate to the second substrate structure, as shown. Also shown, the first substrate includes exposed region, which has the plurality of dummy metal layers, which are made during the same processing step. Of course, one of ordinary skill in the art would recognize many variations, alternatives, and modifications.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A multilayered integrated optical and circuit device, the device comprising:
    a first substrate comprising a plurality of dies, each of the plurality of dies having at least one integrated circuit chip thereon, the at least one integrated circuit chip comprising a cell region and a peripheral region, the peripheral region comprising a bonding pad region, the bonding pad region comprising one or more electrical wire bonding pads and an antistiction region surrounding each of the one or more bonding pads;
    a second substrate comprising a plurality of optical devices, each of the plurality of optical devices having at least one or more deflection devices thereon, wherein each of the plurality of optical devices is coupled to the at least one integrated circuit chip on the first substrate and exposing at least one or more bonding pads on the first substrate;
    a transparent member overlying the second substrate and forming a sandwich structure including at least a portion of the first substrate, a portion of the second substrate, and a portion of the transparent member, thereby forming a plurality of cavity regions to allow the at least one or more deflection devices in each of the plurality of optical devices to move within a portion of the plurality of cavity regions, wherein the one or more bonding pads and the antistiction region of each of the plurality of integrated circuit chips are disposed outside the cavity region while each of the plurality of optical devices are maintained within a portion of the plurality of cavity regions.

2. The device of claim 1 wherein the first substrate comprises a silicon wafer containing the at least one integrated circuit chip.

3. The device of claim 1 wherein the transparent member comprises a transparent plate coupled to a frame structure, the frame structure forming a portion of the cavity region bounded by a portion of the transparent plate.

4. The device of claim 1 wherein the transparent member comprises a covalent bond to a portion of the second substrate.

5. The device of claim 1 wherein the antistiction region comprises a metal material.

6. The device of claim 1 wherein the transparent member comprises a portion bonded to regions surrounding each of the cell regions.

7. The device of claim 1 wherein the transparent member comprises a substantially planar glass member coupled to a frame member.

8. The device of claim 7 wherein the frame member includes a plurality of cavities.

9. The device of claim 7 wherein the substantially planar glass member is sealed to the frame member.

10. A multilayered integrated optical and circuit device, the device comprising:
 a first substrate comprising a plurality of dies, each of the plurality of dies having at least one integrated circuit chip thereon, the at least one integrated circuit chip comprising a cell region and a peripheral region, the peripheral region comprising a bonding pad region, the bonding pad region comprising one or more electrical wire bonding pads;
 a second substrate comprising:
  a plurality of optical devices, each of the plurality of optical devices having at least one or more deflection devices thereon, wherein each of the plurality of optical devices is coupled to the at least one integrated circuit chip on the first substrate and exposing at least one or more bonding pads on the first substrate; and
  an antistiction region surrounding each of the one or more bonding pads and exposing at least one bonding pad from the one or more bonding pads on the first substrate; and
 a transparent member overlying the second substrate and forming a sandwich structure including at least a portion of the first substrate, a portion of the second substrate, and a portion of the transparent member, thereby forming a plurality of cavity regions to allow the at least one or more deflection devices in each of the plurality of optical devices to move within a portion of the plurality of cavity regions, wherein the one or more bonding pads and the antistiction region of each of the plurality of integrated circuit chips are disposed outside the cavity region while each of the plurality of optical devices are maintained within a portion of the plurality of cavity regions.

11. The multilayered integrated optical and circuit device of claim 10 wherein the first substrate is a CMOS wafer.

12. The multilayered integrated optical and circuit device of claim 10 wherein the second substrate includes single crystal silicon.

13. The multilayered integrated optical and circuit device of claim 10 wherein the antistiction region comprises at least one of aluminum, titanium, titanium nitride, gold, silver or copper.

14. The multilayered integrated optical and circuit device of claim 10 wherein the antistiction region comprises one or more dummy metal layers surrounding the one or more bonding pads.

* * * * *